(12) United States Patent
Cecchi et al.

(10) Patent No.: US 6,504,417 B1
(45) Date of Patent: Jan. 7, 2003

(54) ACTIVE TRIM CIRCUIT FOR CMOS ON-CHIP RESISTORS

(75) Inventors: Delbert R. Cecchi, Rochester, MN (US); Charles C. Hanson, Kenyon, MN (US); Curtis W. Preuss, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/930,670

(22) Filed: Aug. 15, 2001

(51) Int. Cl.[7] ................................................ H03L 5/00
(52) U.S. Cl. ....................................................... 327/308
(58) Field of Search ................................. 327/308, 403, 327/404, 405

(56) References Cited

U.S. PATENT DOCUMENTS 5,936,563 A * 8/1999 Nakamura ................... 341/144
6,294,947 B1 * 9/2001 Gabara ........................ 323/312

* cited by examiner

*Primary Examiner*—Jeffrey Zweizig
(74) *Attorney, Agent, or Firm*—Bockhop & Reich, LLP

(57) ABSTRACT

A resistance circuit includes an off-chip resistor having a precision resistance; a plurality of on-chip switchable resistors, each of which is capable being switched so as to be coupled in parallel to a nominal resistor; and a resistance comparison unit. The resistance comparison unit compares a plurality of on-chip comparison resistors to the off-chip resistor and couples a number of the on-chip switchable resistors to the nominal resistor so that the combined resistance of the parallel combination of the nominal resistor and the coupled on-chip switchable resistors is within a predetermined range of the precision resistance.

8 Claims, 2 Drawing Sheets

ACTIVE TRIM CIRCUIT FOR CMOS ON-CHIP RESISTORS

BACKGROUND OF THE INVENTION

1. Field of the Invention

The present invention relates to electronic circuits and, more specifically, to a trim circuit that increases precision in on-chip resistors.

2. Description of the Prior Art

In many applications, a precise value of resistance is necessary on an integrated circuit chip. It is particularly important when the on-chip circuit must interface with external components, such as a circuit on a printed circuit board, a cable connector, or another chip. A classic example of a circuit requiring precise resistance is an on-chip terminator for a transmission line cable. For an on-chip driver to drive and receive properly, it must be terminated with the characteristic impedance of the cable. An imprecise resistance in the terminator could result in undesirable ringing and other transmission line effects.

Typically, on-chip resistors are designed for nominal process and temperature variations. The tolerances obtained by this method frequently causes performance limitations. This is due to the wide value variations that are caused by production and environmental conditions.

Also, in some applications it is desirable to adjust the terminator to match different design values due to a package change or a connector change. Current on-chip resistors are not capable of changing resistance values once the chip has been manufactured.

Therefore, there is a need for an on-chip resistor that may be tuned to a precise resistance after the chip on which the resistor resides has been manufactured.

SUMMARY OF THE INVENTION

The disadvantages of the prior art are overcome by the present invention which, in one aspect, is a resistance circuit that includes an off-chip resistor having a precision resistance, a plurality of on-chip switchable resistors and a resistance comparison unit. The plurality of on-chip switchable resistors are each capable being switched so as to be coupled in parallel to a nominal resistor. The resistance comparison unit compares a plurality of on-chip comparison resistors to the off-chip resistor and couples a number of the on-chip switchable resistors to the nominal resistor so that the combined parallel resistance of the nominal resistor and the on-chip switchable resistors coupled to the nominal resistor is within a predetermined range of the precision resistance.

This resistance circuit offers the advantage of being able to tune an on-chip resistor to a resistance within a predetermined range after the chip has been manufactured.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
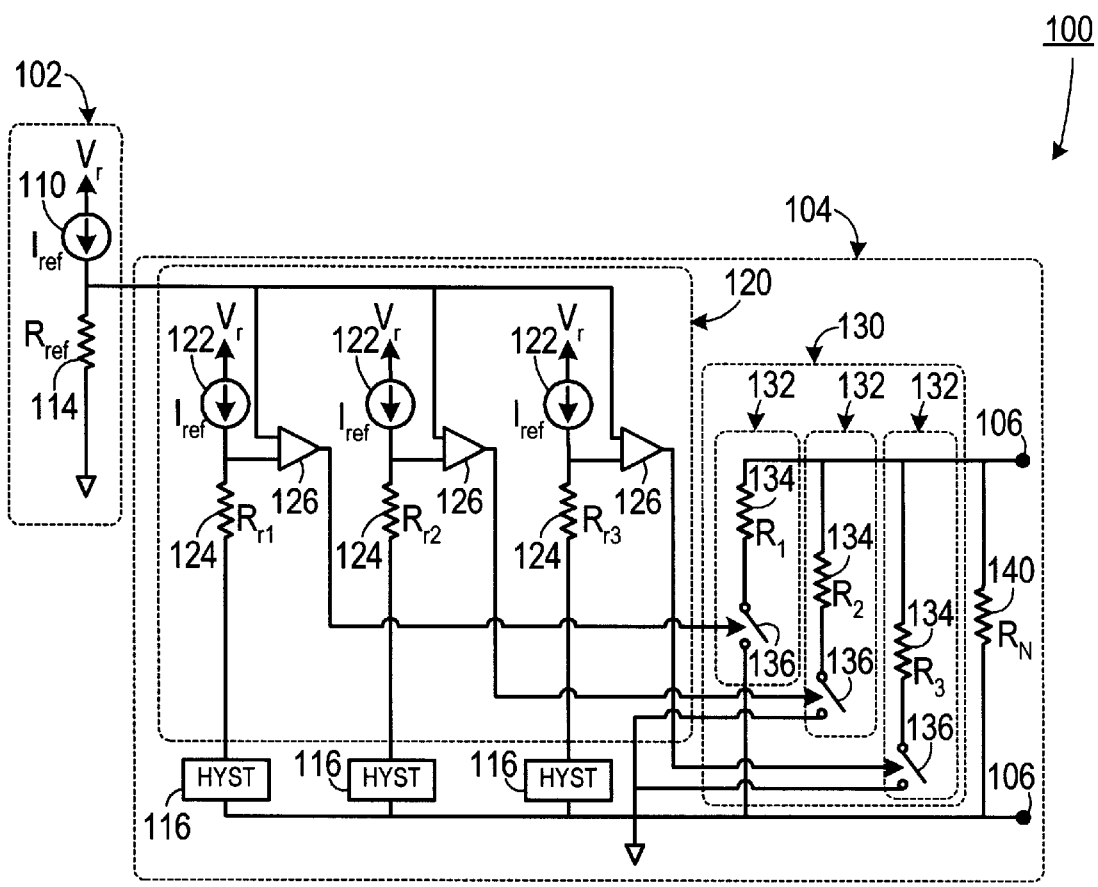
FIG. 1 is a schematic diagram of one embodiment of the invention.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

As shown in FIG. 1, one illustrative embodiment of the invention includes a resistance circuit 100 that allows for fine tuning of a resistance on an integrated circuit chip. The resistance circuit 100 includes an off-chip component 102 and an on-chip component 104. The off-chip component 102 includes a current source 110 and an off-chip reference resistor 114 having a precision resistance within a predetermined tolerance.

The on-chip component 104 includes a resistance comparison unit 120 and a parallel resistor unit 130. The parallel resistor unit 130 includes a plurality of switchable resistor units 132 arranged in parallel. Also coupled in parallel with the parallel resistor unit 130 is a nominal resistor 140. Each switchable resistor unit 132 includes a semiconductor resistor 134 and a semiconductor switch 136 that is controlled by the resistance comparison unit 120.

Figure 4:
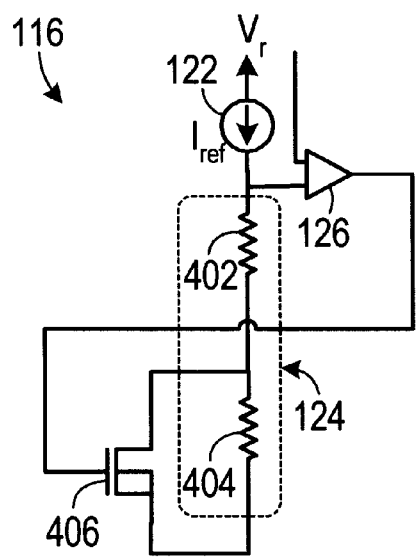
FIG. 4 a schematic diagram of one specific embodiment of a hysteresis circuit, according to the invention.

The resistance comparison 120 unit includes a plurality of comparison resistors 124, a corresponding plurality of mirrored current sources 122, that drive a reference current through the comparison resistors 124 and a plurality of comparators 126, each of which compares the voltage across a corresponding comparison resistor 124 to the voltage across the reference resistor 114, thereby determining if the resistance of the comparison resistor 124 is greater than the resistance of the reference resistor 114. Each comparator 126 generates a signal having a first state if the comparison resistance is greater than the reference resistance and a different second state if the comparison resistance is not greater than the reference resistance. The resistance comparison unit 120 compares the on-chip comparison resistors 124 to the off-chip reference resistor 114 to determine if the actual resistance of the comparison resistors 124 has exceeded the resistance of the off-chip reference resistor 114. Such a change in resistance could occur, for example, as a result of increased temperature. Each comparison resistor 124 has a nominal resistance that is different than the precision resistance by a different predetermined amount so that the comparators 126 enter the first state as the resistance of the comparison resistors 124 changes by varying amounts. A hysteresis circuit 116 may be coupled to each comparison resistor 124 to prevent chattering in the circuit. In one illustrative example of the hysteresis circuit 116, shown in FIG. 4, each comparison resistor 124 is actually formed by two resistors in series 402 and 404, with an n-channel FET 406, driven by the output of the corresponding comparator 126, coupling one of the series resistors 404 to ground. Thus, when the comparator 126 turns on the corresponding switchable resistor 134, a portion 404 of the series comparison resistor 124 is grounded, thereby lowering the resistance of the comparison resistor 124 and ensuring that the switchable resistor 134 will stay on unless the resistance of the comparison resistor 124 falls below a predetermined threshold.

Returning to FIG. 1, the outputs of the comparators 126 are coupled to the switches 136 so that as the resistances of the on-chip resistors increase, the switches 136 begin to close so as to couple the switchable semiconductor resistors 134 to the nominal resistor 140. This causes the parallel resistance of the nominal resistor 140 and the switchable semiconductor resistors 134 that are shunted due to the closing of their switches 136 to be reduced. The nominal resistor 140 may have a nominal resistance that is slightly higher than the resistance of the reference resistor 114 to allow the system to be adjusted to handled both increases and decreases in on-chip resistance.

Figure 2:
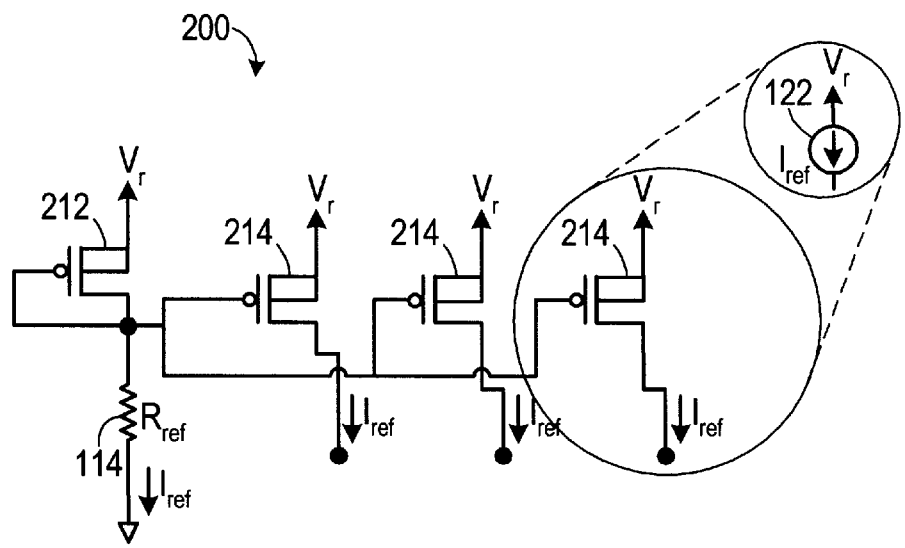
FIG. 2 is a schematic diagram of a current mirror employed in one embodiment of the invention.

The current mirror 200 is shown in more detail in FIG. 2. A driving current source transistor 212 has its gate connected to its drain, which in turn is coupled to the reference resistor 114. The gate of each mirrored current source transistor 214 is coupled to the drain of the driving current source transistor 212 so that the gates of all of the current source transistors 212 and 214 have the same voltage applied to them. This ensures that the same current is sourced from the drains of each of the current source transistors 212 and 214. Thus, as can be seen, each of the mirrored current source transistors 214 is a mirrored current source 122, as shown in FIG. 1. Because the current flowing through each of the comparison resistors 124 is the same as the current flowing through the reference resistor 114, any difference between the voltage across the reference resistor 114 and a comparison resistor 124 is a function of a difference in resistance between the reference resistor 114 and the comparison resistor 124.

Figure 3:
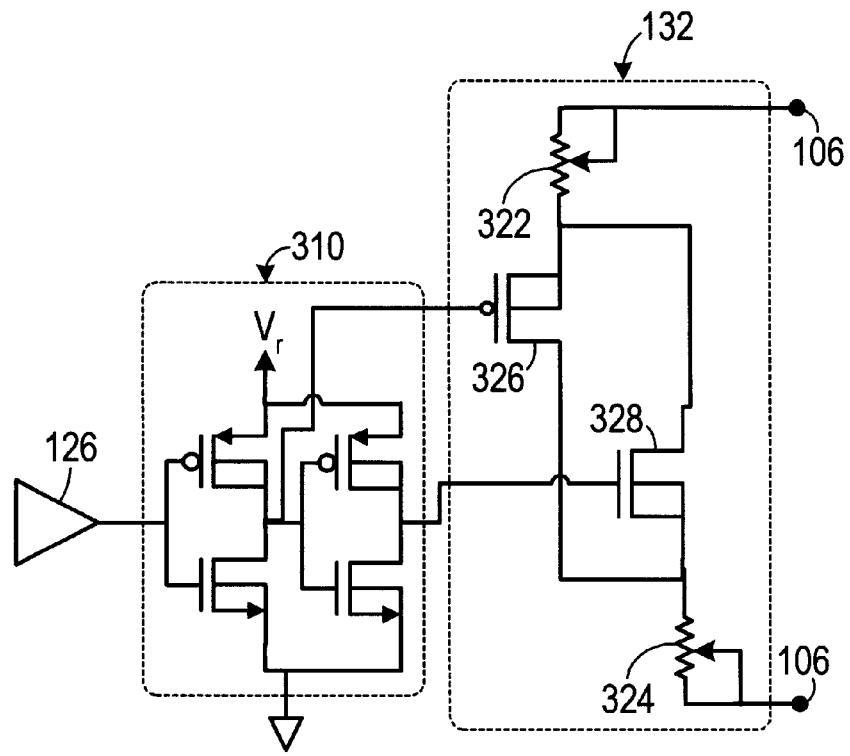
FIG. 3 a schematic diagram of one specific embodiment of an on-chip switchable resistor unit, according to the invention.

One embodiment of a switchable resistor unit 132 is shown in FIG. 3. In this embodiment, the output of the comparator 126 drives a CMOS driver 310 that generates two voltages of opposite value. One of the voltages drives an N-channel field effect transistor (NFET) 328 and the other voltage drives a P-channel field effect transistor (PFET) 326. The NFET 328 and the PFET 326 are set between two resistors 322 and 324 that have a combined series resistance. Each of the resistors is coupled to a rail 106, which is parallel coupled to corresponding resistors in other switchable resistor units.

In one illustrative example, the reference resistor 114 and the nominal resistor 140 could each have a resistance value of 100Ω, the reference resistors 124 each have the following nominal resistances: $R_{r1}=95\Omega$, $R_{r2}=90\Omega$, and $R_{r3}=85\Omega$, and the switchable resistors 134 each have the following nominal resistances: $R_1=2100\Omega$, $R_2=2310\Omega$, and $R_3=2516\Omega$. As the temperature of the chip 104 increases, the resistances of all of the on-chip resistors will increase at substantially the same rate. Thus, when the sensed resistance of $R_{r1}$ reaches 100Ω, the resistance of the nominal resistor 140 will reach 105Ω, and the comparator 126 coupled to resistor $R_{r1}$ will close the switch 136 connected to $R_1$, thereby placing $R_1$ in parallel with the nominal resistor 140. The parallel resistance of resistor 140 and resistor $R_1$ will then be approximately 100Ω. As the temperature rises further, the $R_2$ is placed in parallel and then $R_{13}$ thereby maintaining the total resistance in parallel with the nominal resistor 140.

While only three comparison resistors 124 and three switchable resistor units 132 are shown in the figures for clarity, it is understood that any number of comparison resistors 124 and switchable resistor units 132 may be used to give the desired level of precision and range of tuning, depending upon the application.

The above described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. A resistance circuit, comprising:
   a. an off-chip resistor having a precision resistance;
   b. a plurality of on-chip switchable resistors, each of which is capable being switched so as to be coupled in parallel to a nominal resistor; and
   c. a resistance comparison unit that compares a plurality of on-chip comparison resistors to the off-chip resistor and couples a number of the on-chip switchable resistors to the nominal resistor so that a combined parallel resistance of the nominal resistor and the on-chip switchable resistors coupled to the nominal resistor is within a predetermined range of the precision resistance.

2. A resistance circuit, comprising:
   a. an off-chip resistor having a precision resistance within a predetermined tolerance;
   b. a plurality of on-chip switchable resistor units, each switchable resistor unit including a switchable resistor, electrically coupled to a first node, and a controllable switch, having an open state and a closed state, that is capable of electrically coupling the resistor to a second node so that each of the resistors are electrically coupled to each other in parallel when the controllable switch for each resistor is in a state where the resistor is electrically coupled to the second node, each switchable resistor having a corresponding resistance, the plurality of switchable resistors having a parallel resistance that equals the corresponding resistance of the switchable resistors, added in parallel, of each switchable resistor unit that has a controllable switch that is in the closed state;
   c. a comparison resistance unit, electrically coupled to the first node and to the second node, the comparison resistance unit having a comparison unit resistance having a nominal value; and
   d. a resistance comparison circuit, electrically coupled to each of the controllable switches so as to be able to open and close each of the controllable switches independently, that compares the precision resistance to the comparison unit resistance and that closes a number of the controllable switches sufficient to cause the parallel resistance to have a value within a predetermined range of the precision resistance, the resistance of the switchable resistors being estimated based on the comparison unit resistance.

3. The resistance circuit of claim 2, further comprising an on-chip nominal resistor, in parallel with the parallel resistance, that has a nominal resistance equal to the precision resistance.

4. The resistance circuit of claim 2, wherein the comparison resistance unit comprises a plurality of comparison resistors, each having a comparison resistance, wherein a first current flows through the off-chip resistor, the resistance circuit further comprising a current mirror that causes a second current, that is substantially equal to the first current, to flow through each of the plurality of comparison resistors.

5. The resistance circuit of claim 4, wherein the resistance comparison circuit comprises a plurality of comparators, each comparator including:
 a. an output that is coupled to a different one of the controllable switches;
 b. a first input that is electrically coupled to the off-chip resistor so as to be able to sense the precision resistance; and
 c. a second input that is electrically coupled to a different one of the comparison resistors, each comparator capable of comparing the precision resistance to comparison resistance of a corresponding comparison resistor, each output having a first state that causes the corresponding controllable switch to open and a different second state that causes the corresponding controllable switch to close.

6. The resistance circuit of claim 5, wherein each of the plurality of comparators compares resistance of the comparison resistors and the off-chip resistor by comparing a voltage sensed at the off-chip resistor to a voltage sensed at the corresponding comparison resistor.

7. The resistance circuit of claim 6, wherein each comparison resistance has a nominal value that is less than the precision resistance by a different predetermined amount so that as the comparison resistance of each comparison resistor exceeds the precision resistance, a corresponding comparator causes an additional controllable switch to be closed.

8. A method of tuning a on-chip resistance of an on-chip resistor unit, comprising the steps of:
 a. comparing a comparison resistance of an on-chip comparison resistor to an off chip precision resistor having a precision resistance within a predetermined tolerance; and
 b. coupling a number of on-chip parallel resistors in parallel with an on-chip nominal resistor, thereby generating the on-chip resistance, the number of on-chip parallel resistors coupled to with the on-chip nominal resistor being determined as a result of the comparing step.

* * * * *